(12) United States Patent
Kim

(10) Patent No.: US 10,642,512 B2
(45) Date of Patent: May 5, 2020

(54) LOW-SPEED MEMORY OPERATION

(71) Applicant: Micron Technology, Inc., Boise, ID (US)

(72) Inventor: Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 16/121,222

(22) Filed: Sep. 4, 2018

(65) Prior Publication Data

US 2020/0073562 A1  Mar. 5, 2020

(51) Int. Cl.
*G06F 12/00* (2006.01)
*G06F 3/06* (2006.01)
*G06F 12/02* (2006.01)

(52) U.S. Cl.
CPC .......... *G06F 3/0625* (2013.01); *G06F 3/0632* (2013.01); *G06F 3/0659* (2013.01); *G06F 3/0673* (2013.01); *G06F 12/0238* (2013.01); *G06F 12/0246* (2013.01); *G06F 2212/7201* (2013.01); *G06F 2212/7208* (2013.01)

(58) Field of Classification Search
CPC .... G06F 3/0625; G06F 3/0632; G06F 3/0659; G06F 3/0673; G06F 12/0238; G06F 12/0246; G06F 2212/7201; G06F 2212/7208
See application file for complete search history.

(56) References Cited

U.S. PATENT DOCUMENTS 8,645,117 B2 * 2/2014 Yin ..................... G06F 17/5022
                                                                   703/19
2009/0055678 A1    2/2009 Kummaraguntla et al.

\* cited by examiner

*Primary Examiner* — Shawn X Gu
(74) *Attorney, Agent, or Firm* — Holland & Hart LLP

(57) ABSTRACT

Methods, systems, and devices for a low-speed memory operation are described. A controller associated with a memory device may, for example, identify a clock mode for a system clock and determine that a speed of the system clock is below a threshold. The controller may generate (or cause to be generated) an internal data clock signal having a shorter period than an external data clock signal (which may have a speed based on the system clock speed). Also, the controller may use, instead of the external data clock signal, the internal data clock signal to generate data from the memory device, which may provide reduced latency. Further, the controller may deactivate (or cause to be deactivated) an external data clock that generates the external data clock signal.

35 Claims, 7 Drawing Sheets

LOW-SPEED MEMORY OPERATION

BACKGROUND

The following relates generally to operating a memory device, and more specifically to achieving relatively high performance of a memory device while operating the memory device at a relatively low speed.

A system may include a memory subsystem that includes one or more memory devices. Memory devices are widely used to store information in various electronic devices such as computers, wireless communication devices, internet of things, cameras, digital displays, and the like. Information is stored by programming different states of memory cells in a memory device. For example, binary memory cells may store two states, often denoted by a logic "1" or a logic "0." In other memory cells (e.g., multi-level memory cells), more than two states may be stored. To access the stored information, a component of the electronic device may read, or sense, the stored state in the memory cells. To store information, a component of the electronic device may write, or program, the state in the memory cells.

Various types of memory devices exist, including magnetic hard disks, random access memory (RAM), read only memory (ROM), dynamic RAM (DRAM), synchronous DRAM (SDRAM), ferroelectric RAM (FeRAM), magnetic RAM (MRAM), resistive RAM (RRAM), flash memory, not-AND (NAND) memory, phase change memory (PCM), and others. Memory devices may be volatile or non-volatile. Non-volatile memory cells may maintain their logic states for extended periods of time even in the absence of an external power source. Volatile memory cells (e.g., DRAM cells) may lose their stored state over time unless they are periodically refreshed by an external power source.

Improving a memory device, generally, may include memory cell density, increasing read/write speeds, increasing reliability, increasing data retention, reducing power consumption, or reducing manufacturing costs, among other metrics.

DETAILED DESCRIPTION

Figure 1:
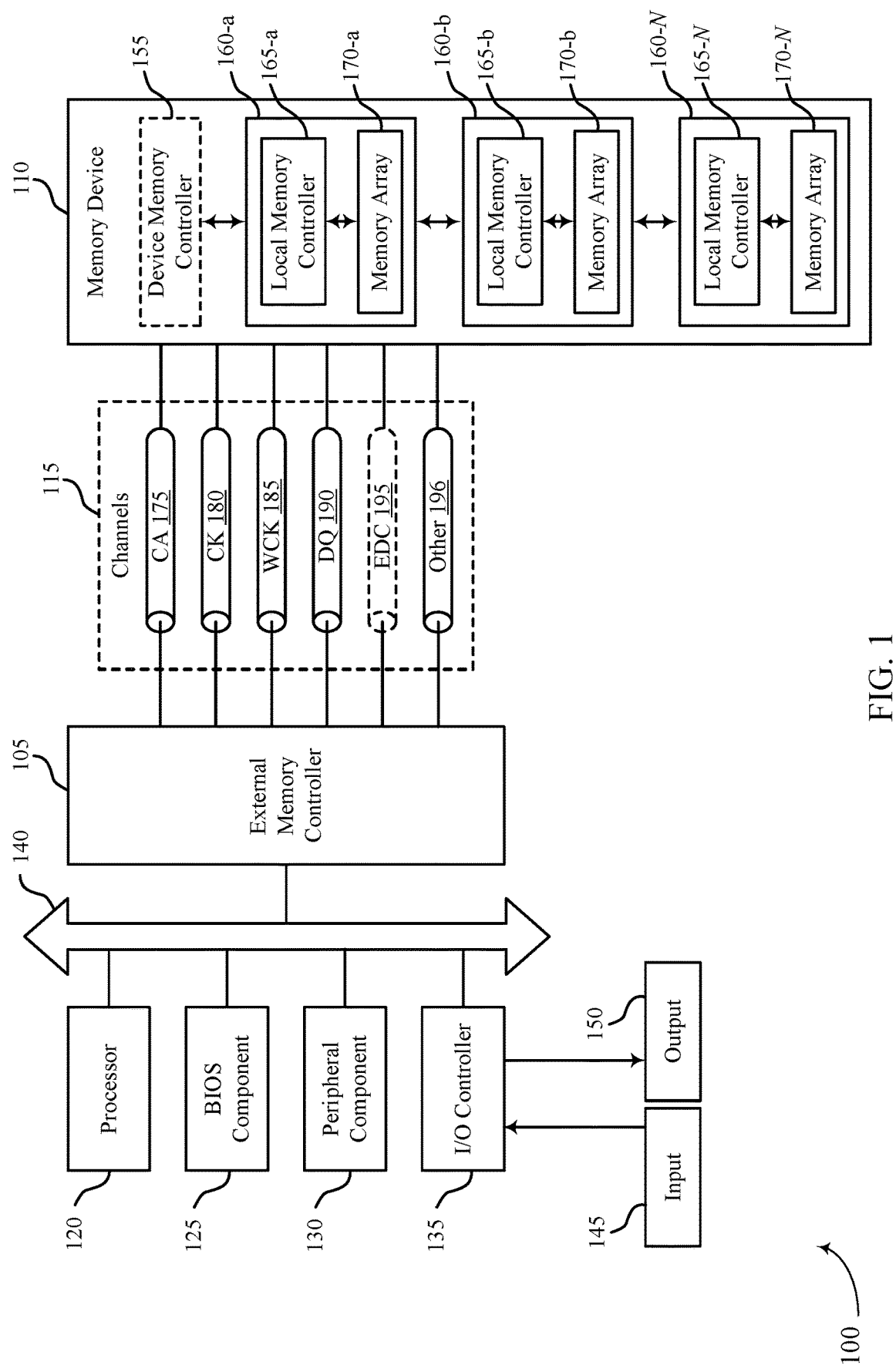
FIG. 1 illustrates an example of a system that supports a low-speed memory operation in accordance with aspects disclosed herein.

A multi-die memory device in a system may include two or more memory dice in a single package to provide a small footprint on a circuit board or other structures. In some cases, memory dice of a multi-die memory device may share one or more common signals, such as common clock signals (e.g., a system clock signal, a common data clock signal), generated by the system (e.g., a host or a controller of the system) or a common component of the memory device (e.g., a controller or other component of the memory device that may be common to multiple memory dice therein). In some cases, common clock signals may consume large amounts of power due to distribution to and use by multiple memory dice. Further, data bandwidth of the system may in some cases be limited by a speed of the common clock signals when one or more memory dice of the multi-die memory device may otherwise support a lower latency for producing a unit of data (e.g., 256-bit data) to the host or the controller of the system accessing the unit of data.

Concepts disclosed herein may reduce power consumption of a system including a multi-die memory device by deactivating a common data clock signal when the system operates with low-speed common clock signals. Further, the concepts may increase data bandwidth (e.g., input/output (I/O) bandwidth) of the system by using an internally generated clock signal (e.g., internal to a memory die) such that a memory die of the multi-die memory device may produce a unit of data (e.g., 256-bit data) at a lower number of system clock edges. The system may, in turn, process a relatively greater quantity of commands (e.g., an increased command bandwidth) associated with the unit of data during a period of time. Thus, the concepts may improve power consumption, I/O bandwidth, and command bandwidth of the system including the multi-die memory device.

In some cases, a controller (e.g., a controller of a system, a memory controller of a multi-die memory device, a local memory controller of a memory die) may identify a clock mode for a system clock. The system clock may generate a common system clock signal (e.g., a CK signal) that may be used by two or more memory dice in the multi-die memory device. Also, a common data clock may, based on the system clock signal, generate a common data clock signal (e.g., a WCK signal) that may also be used by the two or more memory dice in the multi-die memory device. In some cases, the common data clock signal (e.g., a WCK signal) may have a fixed ratio with respect to the system clock signal (e.g., a CK signal). For example, eight (8) periods of the WCK signal may correspond to four (4) periods of CK signal.

The controller may determine that the clock mode corresponds to a low-speed mode (e.g., the system clock may have three speed modes, such as fast, medium, and slow, and the slow speed may correspond to the low-speed mode) or a speed of the system clock may be below a threshold. The controller may generate (or cause to generate) an internal data clock signal (e.g., an iWCK signal internal to a memory die) having a shorter period (and thus a faster frequency) than the WCK signal. Further, the controller may use, instead of the WCK signal, the iWCK signal to generate data from a memory die in a shorter duration. As a result, the memory die may produce data within a lesser quantity of the CK signal periods. In some cases, the memory die using the iWCK signal may produce a set of data (e.g., 256-bit data) within one (1) or two (2) periods of the CK signal, whereas, were the memory die to rely upon the common data clock signal with the system clock (and thus the common data clock) in low-speed mode, the memory die may require more than two periods (e.g., 4 periods) of the CK signal to produce the same set of data. The controller may also deactivate (or cause another component, such as an external or other common controller to deactivate) the common data clock that generates the WCK signal as the memory die uses its own data clock signal (e.g., the iWCK signal). Thus, the controller may improve data bandwidth (e.g., I/O bandwidth) of the multi-die memory device and reduce power consumption of the system including the multi-die memory device.

Each memory die of the multi-die memory device may be configured to receive a system clock signal (e.g., a CK signal), a common data clock signal (e.g., a WCK signal), or both. At least some, if not all, memory dice may also include an internal data clock that generates an internal data clock signal (e.g., an iWCK signal). Further, the memory dice may include a selection component (e.g., a multiplexor) that may be configured to route the WCK signal or the iWCK signal to a data clock tree (e.g., a WCK tree) based on a mode of operation, such as a mode or speed of a system clock (e.g., a low-speed mode, a medium-speed mode, a fast-speed mode). In some cases, the memory dice may include a mode identification component (e.g., a mode register) that may be configured to identify the mode of operation. The mode identification component may activate the internal data clock based on identifying the mode of operation.

Features of the disclosure introduced herein are further described below at an exemplary system level in the context of FIG. 1. Specific examples of a system and a configuration of a memory medium of the system are then described in the context of FIGS. 2 through 4. These and other features of the disclosure are further illustrated by and described with reference to an apparatus diagram of FIG. 5 that describes various components related to a controller as well as flowcharts of FIGS. 6 through 8 that relate to operations of media scrubber operations in a memory system.

FIG. 1 illustrates an example of a system 100 that supports a low-speed memory operation in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the external memory controller 105 may be referred to as a host.

In some cases, a memory device 110 may be an independent device that is configured to be in communication with other components of the system 100 and provide physical memory addresses/space to potentially be used or referenced by the system 100. In some examples, a memory device 110 may be able to work with at least one or a plurality of different types of systems 100. Signaling between the components of the system 100 and the memory device 110 may be operable to support different modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between processor 120 and the various components of the system 100, e.g., peripheral components 130, input/output controller 135, etc. The BIOS component 125 may include a program or software stored in read-only memory (ROM), flash memory, or any other non-volatile memory.

Peripheral component(s) 130 may be any input or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. Peripheral component(s) 130 may be other components understood by those skilled in the art as peripherals.

The I/O controller 135 may manage data communication between the processor 120 and peripheral component(s) 140, input devices 145, or output devices 150. The I/O controller 135 may also manage peripherals that are not integrated into or with the system 100. In some cases, the I/O controller 135 may represent a physical connection or port to the external peripheral.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by I/O controller 135.

The components of system 100 may be made up of general- or special-purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. A memory die 160 may include a local memory controller 165 and a memory array 170. A memory array 170 may be an example of collection (e.g., grid) of memory cells, with each memory cell being configured to store at least one bit of digit data. Features of a memory arrays 170 and/or memory cells are described in more detail with reference to FIG. 2.

The device memory controller 155 may include circuits or components configured to control operations of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die (e.g., a memory array 170) to a component of the system 100 (e.g., the processor 120). In some cases, the device memory controller 155 may control operation of the memory device 110 described herein in conjunction with the local memory controller 165 of the memory die 160. Examples of the components included in the external memory controller 105 may include receivers for demodulating signals received from the external memory controller 105, decoders for modulating and transmitting signals to the external memory controller 105, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions ascribed herein to the device memory controller 155. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to memory device 110, in some cases, external memory controller 105, or its functions as described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In this example, the channels enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at the external memory controller 105 and one or more pins or pads at the memory device 110. A pin may be an example of a conductive input or output point of a device of the system 100, and a pin may be configured to act as part of a channel. In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel 115 and thus may include multiple individual channels. For example, a data channel 190 may be ×4 (e.g., including four signal paths), ×8 (e.g., including eight signal paths), ×16 (including sixteen signal paths), etc.

In some cases, the channels 115 may include one or more command and address (CA) channels 175. The CA channels 175 may be configured to communicate commands between the external memory controller 105 and the memory device 110 including control information associated with the commands (e.g., address information). For example, the CA channel 175 may include a read command with an address of the desired stored data. In some cases, the CA channels 175 may be registered on a rising clock signal edge and/or a falling clock signal edge. In some cases, a CA channel 175 may include eight or nine signal paths.

In some cases, the channels 115 may include one or more clock signal (CK) channels 180. The CK channels 180 may be configured to communicate a common clock signal between the external memory controller 105 and the memory device 110. The clock signal may be configured oscillate between a high state and a low state and coordinate the actions of the external memory controller 105 and the memory device 110. In some cases, the clock signal may be a differential output (e.g., a CK_t signal and a CK_c signal) and the signal paths of the CK channels 180 may be configured accordingly. In some cases, the clock signal may be single ended. In some cases, the clock signal may be a 1.5 GHz signal. A CK channel 180 may include any number of signal paths. In some cases, the clock signal (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more write clock signal (WCK) channels 185. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels 185 may be configured to communicate a common data clock signal between the external memory controller 105 and the memory device 110. The data clock signal may be configured coordinate an access operation (e.g., a write operation, a read operation) of the external memory controller 105 and the memory device 110. In some cases, the write clock signal may be a differential output (e.g., a WCK_t signal and a WCK_c signal) and the signal paths of the WCK channels 185 may be configured accordingly. A WCK channel 185 may include any number of signal paths. The data clock signal WCK may be generated by a data clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated to include symbols using a variety of different modulation schemes (e.g., NRZ, PAM4).

In some cases, the channels 115 may, optionally, include one or more error detection code (EDC) channels 195. The error detection code channels 195 may be configured to communicate error detection signals, such as checksums, to improve system reliability. An EDC channel 195 may include any number of signal paths.

In some cases, the channels 115 may include one or more other channels 196 that may be dedicated to other purposes. These other channels 196 may include any number of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic '1' or a logic '0'). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others. In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic '00', a logic '01', a logic '10', or a logic '11'). Examples of multi-symbol modulation schemes include, but are not limited to, PAM4, PAM8, etc., quadrature amplitude modulation (QAM), quadrature phase shift keying (QPSK), and/or others. Multi-symbol modulation schemes and symbols may alternatively be referred to as non-binary, multi-bit, or higher-order modulation schemes and symbols.

In some cases, a device (e.g., a memory device 110) may include two or more memory dice (e.g., a memory die 160-a and a memory die 160-*b*) where the two or more memory dice (e.g., memory dice 160) are configured to receive a system clock signal (e.g., a command clock signal CK, a control clock signal CK) and a common data clock signal (e.g., a data clock signal WCK). In some cases, the system clock signal and the common data clock signal may be generated by a controller that may be common to the two or more memory dice (e.g., an external memory controller 105 or a device memory controller 155). The common controller may set (or cause to set by transmitting an indication to set) a speed of the system clock signal to a first speed (e.g., a speed corresponding to a low-speed operational mode), where the system clock signal may support the first speed and a second speed (e.g., a speed corresponding to a high-speed operational mode) greater than the first speed. The common controller (e.g., the external memory controller 105 or the device memory controller 155) may also disable (or cause to disable by transmitting an indication to disable) the common data clock signal based on setting the speed of the system clock signal to the first speed.

In some cases, the common controller (e.g., the external memory controller 105 or the device memory controller 155) may be configured to support two or more speeds of the system clock signal (e.g., the CK signal) for the memory device 110. For example, the device memory controller 155 may set a first mode register included in the first memory die (e.g., the memory die 160-*a*) to indicate that the speed of the system clock signal (e.g., the CK signal) may be set to the first speed (e.g., a speed corresponding to a low-speed operational mode). The device memory controller 155 may also set a second mode register included in the second memory die (e.g., the memory die 160-*b*) to indicate that the speed of the system clock signal (e.g., the CK signal) may be set to the second speed (e.g., a speed corresponding to a high-speed operational mode).

In some cases, the common controller (e.g., the external memory controller 105 or the device memory controller 155) may be configured to modify a burst length (e.g., a burst length of 16, a burst length of 32) of an access operation (e.g., a read operation) based on a speed of the system clock signal (e.g., the CK signal). For example, the device memory controller 155 may set a burst length (e.g., a burst length of 32) of an access operation for memory cells included in the first memory die (e.g., the memory die 160-*a*) based on setting the speed of the system clock signal (e.g., the CK signal) to the first speed. In some cases, the device memory controller 155 may set a first mode register included in the first memory die (e.g., the memory die 160-*a*) to indicate the burst length of the access operation (e.g., the burst length of 32) as part of setting the burst length of the access operation.

Figure 2:
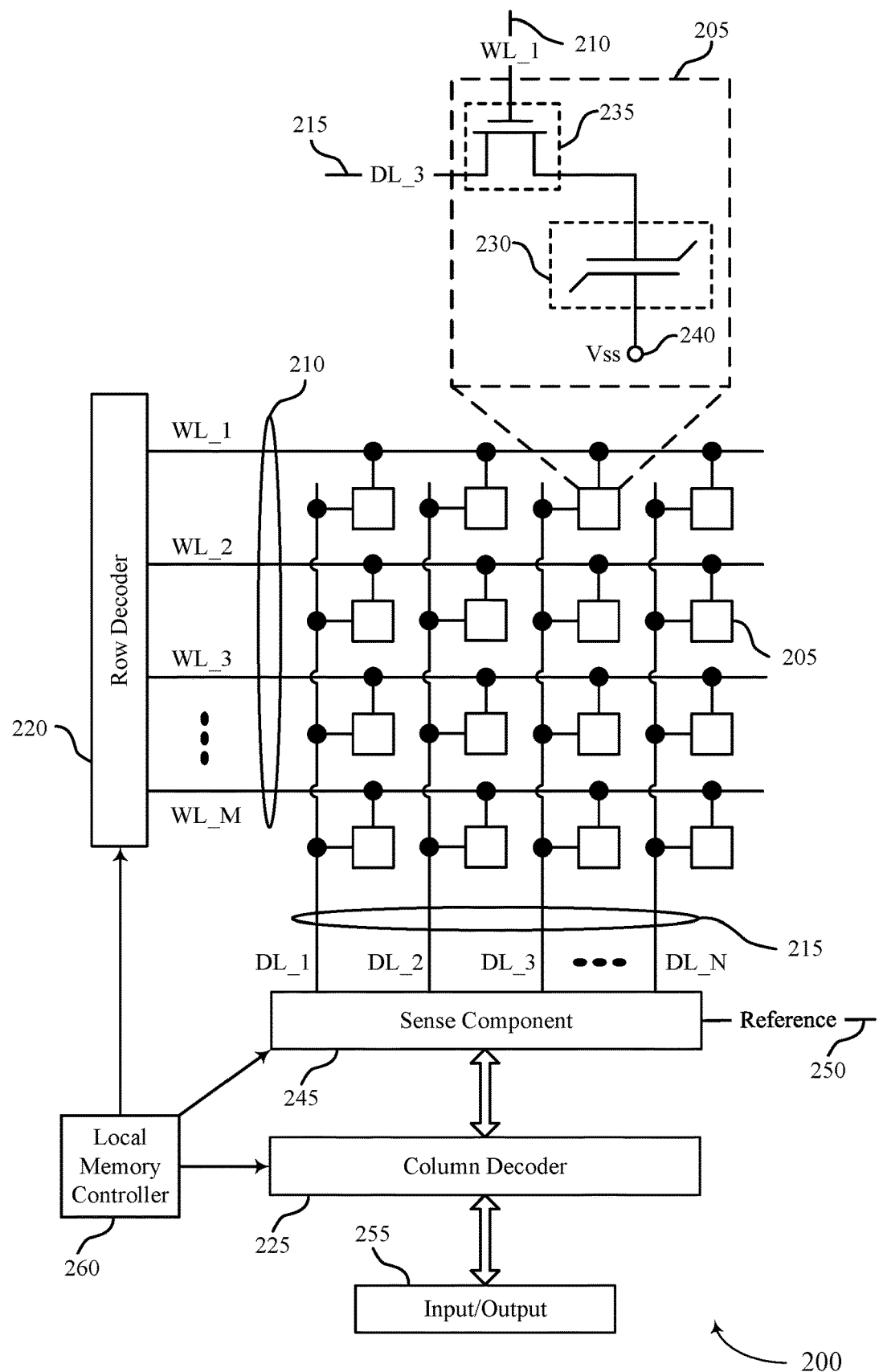
FIG. 2 shows a block diagram of a device that supports a low-speed memory operation in accordance with aspects disclosed herein.

FIG. 2 illustrates an example of a memory die 200 in accordance with various embodiments of the present disclosure. The memory die 200 may be an example of a memory die 160 described with reference to FIG. 1. In some cases, the memory die 200 may be referred to as a memory chip, a memory device, or an electronic memory apparatus. The memory die 200 includes a local memory controller 260 and one or more memory cells 205 that are programmable to store different logic states. The local memory controller 260 may be an example of a local memory controller 165 described with reference to FIG. 1. Each memory cell 205 may be programmable to store two or more states. For example, the memory cell 205 may be configured to store one bit of digital logic at a time (e.g., a logic 0 and a logic 1). In some cases, a single memory cell 205 may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. FeRAM architectures may include a capacitor that includes a ferroelectric material to store a charge and/or a polarization representative of the programmable state.

Operations such as reading and writing may be performed on memory cells 205 by activating or selecting access lines such as a word line 210 and/or a digit line 215. In some cases, digit lines 215 may also be referred to as bit lines 215. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid like pattern. Memory cells 205 may be positioned at intersections of word lines 210 and digit lines 215. By biasing one word line 210 and one digit line 215 (e.g., applying a voltage to the word line 210 or digit line 215), a single memory cell 205 may be accessed at their intersection.

Accessing memory cells 205 may be controlled through a row decoder 220, a column decoder 225. For example, a row decoder 220 may receive a row address from the local memory controller 260 and activate the appropriate word line 210 based on the received row address. Similarly, a column decoder 225 receives a column address from the local memory controller 260 and activates the appropriate digit line 215. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 is a ground such as Vss. In some cases, the voltage source 240 may be an example of a plate line coupled with a plate line driver.

The switching component 235 may be an example of a transistor or any other type of switch device that selectively establishes or de-establishes electronic communication between two components. As described herein, various states may be stored by charging or discharging capacitor 230.

Selecting or deselecting the memory cell 205 may be accomplished by activating or deactivating the switching component 235. The capacitor 230 may be connected with digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation is controlled by applying a voltage to the transistor gate, where the voltage differential between the transistor gate and transistor source may be greater or less than a threshold voltage of the transistor. The word line 210 may be connected with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 with the digit line 215. In some architectures, the memory cell 205 may be in electronic communication (e.g., constant) with the digit line 215.

The sense component 245 may be configured to detect charge stored on the capacitor 230 of the memory cell 205 and determine a logic state of the memory cell 205 based on the stored charge. The charges stored by memory cells 205 may be extremely small, in some cases. As such, the sense component 245 may include one or more sense amplifiers to amplify the signal output by the memory cell 205. The sense amplifiers may detect minute changes in the charge of a digit line 215 during a read operation and may produce voltages corresponding to a logic state 0 or a logic state 1 based on the detected charge. During a read operation, the capacitor 230 of memory cell 205 may discharge its charge onto its corresponding digit line 215. The discharging may cause a voltage of the digit line 215 to change. The sense component 245 may be configured to compare the signal received from the memory cell 205 across the digit line 215 to a reference voltage 250 in order to determine the stored state of the memory cell 205. For example, in binary-signaling, if digit line 215 has a higher voltage than the reference voltage 250, the sense component 245 may determine that the stored state of memory cell 205 is a logic 1 and, if the digit line 215 has a lower voltage than the reference voltage 250, the sense component 245 may determine that the stored state of the memory cell 205 is a logic 0. The sense component 245 may include various transistors or amplifiers in order to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be connected to or in electronic communication with column decoder 225 or row decoder 220.

The local memory controller 260 may control the operation (e.g., read, write, re-write, refresh, discharge) of memory cells 205 through the various components (e.g., row decoder 220, column decoder 225, and sense component 245). The local memory controller 260 may be an example of a local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations of the memory die 200, and communicate data from the memory die 200 to the external memory controller 105 (or the device memory controller 155) in response to performing the one or more operations. The local memory controller 260 may generate row and column address signals in order to activate the desired word line 210 and the desired digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation on one or more memory cells 205 of the memory die 200. During a write operation, the logic state of one or more memory cells 205 of the memory die 200 may be set to store a desired logic state. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific voltage to the digit line 215 during the write operation to store a specific charge in the capacitor of the memory cell 205, the specific charge being indicative of a desired logic state.

In some cases, the local memory controller 260 may be configured to perform a read operation on one or more memory cells of the memory die 200. During a read operation, the logic state of one or more memory cells 205 of the memory array may be determined. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The targeted memory cell 205 may transfer its charge to the sense component 245 (either directly or indirectly). The local memory controller 260 may fire the sense component 245 (e.g., latch the sense component) and thereby compare the signal received from the memory cell 205 to a reference voltage 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some cases, the memory die 200 includes a two-dimensional (2D) memory array or a three-dimensional (3D) memory array. A 3D memory array may include two or more 2D memory arrays formed on top of one another. This may increase the number of memory cells that may be placed or created on a single die or substrate as compared with 2D arrays, which in turn may reduce production costs or increase the performance of the memory array, or both. The memory die 200 may include any number of decks or levels. In some 3D memory arrays, each level in a row may have common conductive lines such that each level may share word lines 210 or digit lines 215 or contain separate word lines 210 or digit lines 215. Thus, in a 3D configuration, one word line 210 and one digit line 215 of a same level may be activated to access a single memory cell 205 at their intersection.

In some cases, a controller (e.g., the local memory controller 260 of the memory die 200) may receive a system clock signal (e.g., a CK signal) generated by a system (e.g., a host or a controller of a system including the memory die 200). The controller may receive the system clock signal via another controller (e.g., a device memory controller 155 of a memory device 110 as described with reference to FIG. 1).

The controller (e.g., the local memory controller 260) may identify a system clock speed associated with the system clock signal as below a threshold (e.g., a system clock speed corresponding to a low-speed operational mode). Then, the controller may disconnect (or cause to disconnect by transmitting an indication to disconnect to the host or the controller of the system) a common data clock from a data clock tree (e.g., a WCK tree) in the memory die 200. The WCK tree may be configured to provide a final data clock signal for the memory die 200 to use to access memory cells 205 in response to an access operation (e.g., a read operation). Further, the common data clock may be configured to generate a common data clock signal (e.g., a WCK signal that may be common to two or more memory dice 200) for the memory die 200 to receive. In some cases, the common data clock may be external to the memory die 200—e.g., a part of the host or the controller of the system, or other components of the system.

In some cases, the controller (e.g., the local memory controller 260) may connect an internal data clock in the memory die 200 to the data clock tree (e.g., the WCK tree in the memory die 200) based on identifying the system clock speed as below the threshold. The controller may also, based on identifying the system clock speed as below the threshold, activate the internal data clock such that the memory die 200 may use an internal data clock signal (e.g., an iWCK signal) generated by the internal data clock to access memory cells 205, which may conserve power or other resources when not utilizing the internal data clock signal. In some cases, the access operation (e.g., retrieving a set of data from the memory cells) may have a duration that may be less than one (1) or two (2) periods of the system clock signal (e.g., the CK signal). In some cases, the internal data clock signal (e.g., the iWCK signal) may have a period that may be shorter than a period of the common data clock signal (e.g., the WCK signal), and thus a frequency that may be higher (which may also be referred to as a faster speed) than a frequency of the common data clock signal.

Thus, the controller (e.g., the local memory controller 260) may, during the low-speed operational mode, disconnect (e.g., deactivate, cause to deactivate) the common data clock to reduce power consumption and choose to use the internally-generated data clock signal (e.g., the iWCK signal) that may operate faster than the common data clock signal (e.g., the WCK signal). Thus, when the system clock is at a relatively low speed, use of the internally-generated data clock signal (as opposed to the common data clock signal) may support the memory die 200 producing a set of data (e.g., 256-bit data) at a lower number of the system clock edges (e.g., the CK signal edges) to increase a data bandwidth (e.g., I/O bandwidth) or to process more quantity of commands associated with the set of data during a duration to increase a command bandwidth. Thus, the concepts disclosed herein may improve power consumption, I/O bandwidth, and command bandwidth of the memory device during a low-speed operational mode.

In some cases, the controller (e.g., the local memory controller 260) may support using the common data clock signal (e.g., the WCK signal) when the local memory controller 260 identifies the system clock speed associated with the system clock signal (e.g., the CK signal) as above the threshold (e.g., the system clock speed corresponding to a high-speed operational mode, or in some cases, any mode other than a minimum/low-speed mode, such as a medium-speed mode). The local memory controller 260 may connect (or cause to connect) the common data clock to the data clock tree (e.g., the WCK tree) of the memory die 200 based on identifying the system clock speed as above the threshold and disconnect (or deactivate) the internal data clock from the data clock tree (e.g., the WCK tree). Further, the local memory controller 260 may deactivate the internal data clock.

Various examples described herein may use DRAM cells (or FeRAM cells) to illustrate how the memory die 200 including the local memory controller 260 may be configured and operate in conjunction with a common controller (e.g., an external memory controller 105 or a device memory controller 155 as described with reference to FIG. 1) in accordance with the methods, devices, and systems supporting a low-speed memory operation disclosed herein. In some cases, the memory die 200 may include other types of memory cells employing different memory technologies than DRAM technology or FeRAM technology, such as 3D XPoint™ memory technology, PCM technology, MRAM technology, among others. As such, the concepts described herein may be applied to any type of memory cells that uses clocked operations.

Figure 3:
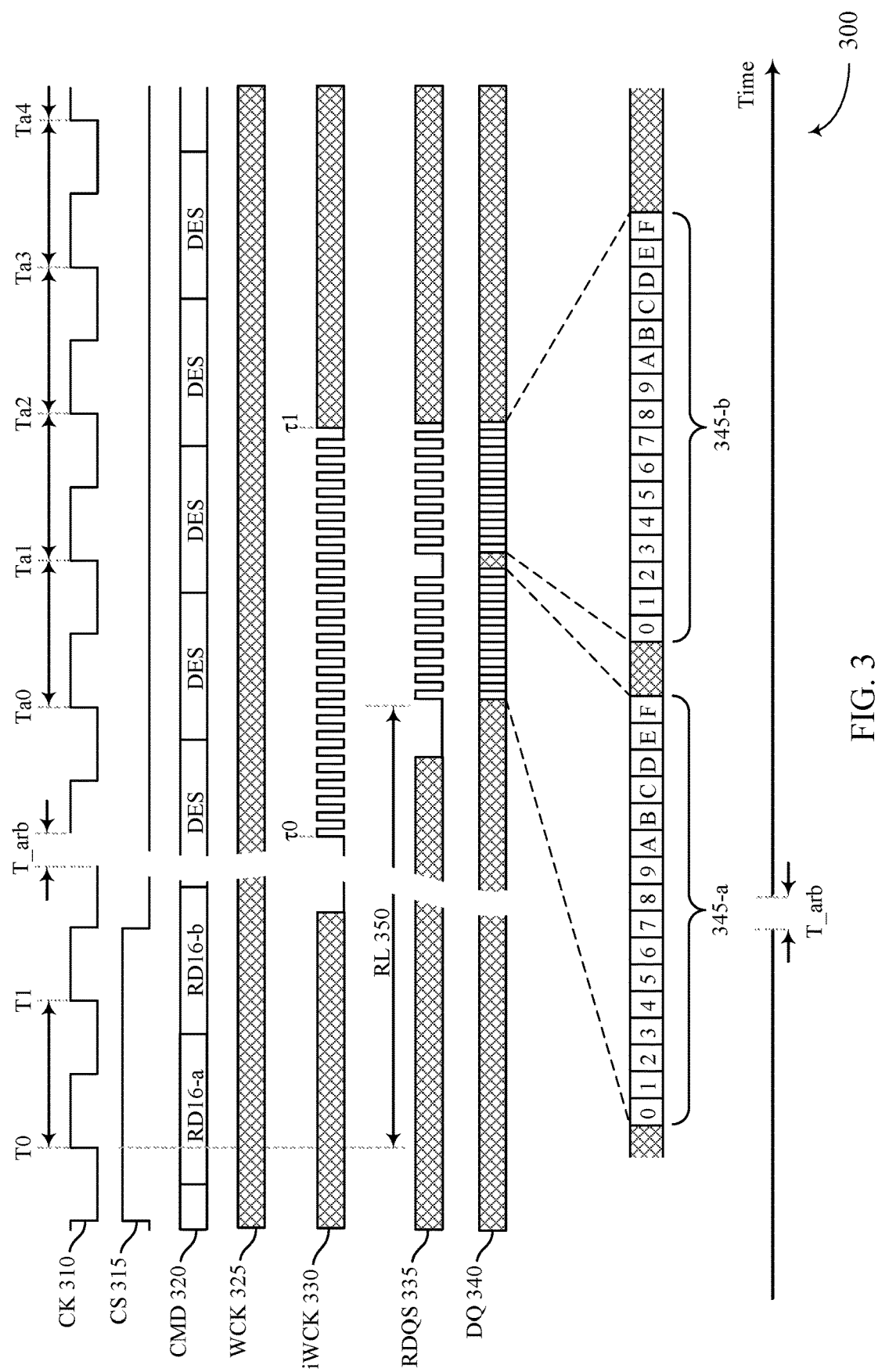
FIG. 3 illustrates an exemplary timing diagram that supports a low-speed memory operation in accordance with aspects disclosed herein.

FIG. 3 illustrates an exemplary timing diagram 300 that supports a low-speed memory operation in accordance with aspects disclosed herein. The timing diagram illustrates various clock signals and signals related to generating sets of data (e.g., two sets of data) during access operations (e.g., one or more read operations retrieving two set of data). The timing diagram 300 illustrates a system clock signal 310 (i.e., CK 310), a chip select signal 315 (i.e., CS 315), a command signal 320 (i.e., CMD 320), a common data clock signal 325 (i.e., WCK 325), an internal data clock signal 330 (i.e., iWCK 330), a read data (DQ) strobe signal 335 (i.e., RDQS 335), and a data (DQ) signal 340 (i.e., DQ 340). The timing diagram 300 also depicts an arbitrary break in time (i.e., T_arb) to illustrate that some features described herein may not be limited by particular quantities of time duration (e.g., a read latency (i.e., RL 350) may be associated with any quantity of periods of the system clock signal, CK 310). The timing diagram 300 may describe aspects of an access operation supported by an external memory controller 105, a device memory controller 155, or a local memory controller 165, or any combination thereof, as described with reference to FIG. 1.

Various signals of the timing diagram 300 may be carried by a plurality of channels 115 as described with reference to FIG. 1. In some cases, the CK 310 may be carried by CK channels 180 described with reference to FIG. 1. In some cases, the CS 315 may be carried by other channels 196 described with reference to FIG. 1. In some cases, the CMD 320 may be carried by CA channels 175 described with reference to FIG. 1. In some cases, the WCK 325 may be carried by WCK channels 185 described with reference to FIG. 1. In some cases, the RDQS 335 may be carried by other channels 196 described with reference to FIG. 1. In some cases, the DQ 340 may be carried by DQ channels 190 described with reference to FIG. 1.

A memory device (e.g., a memory device 110, a memory die 160, a memory die 200) may operate using multiple clock signals (e.g., a system clock signal, a common data clock signal). Such clock signals may be generated by an external component (e.g., external to the memory device), such as a host or a controller (e.g., an external memory controller 105) of a system (e.g., a system 100) that includes the memory device. In some cases, two or more memory dice (e.g., the memory dice 160, the memory dice 200) in the memory device (e.g., the memory device 110) may be configured to receive the multiple clock signals.

Further, the memory device may support more than one operational mode such as a low-speed operational mode, a mid-speed operational mode, or a high-speed operational mode, or any combination thereof. In some cases, the system clock signal (e.g., CK 310) may indicate a particular operational mode. For example, a period of a system clock signal (e.g., T0 of CK 310) during a low-speed operational mode may be greater than a period of the system clock signal (e.g., T0 of CK 310) during a high-speed operational mode. In some cases, a mode register in a memory die of the memory device may store indications of operational modes that may be associated with the system clock signal, which may include indications of a speed of the system clock (e.g., a first system clock speed, a second system clock speed). Further, a period of a common data clock signal (e.g., t0 of WCK 325) may be determined (e.g., fixed) based on a period of a system clock signal (e.g., T0 of CK 310). For example, two (2) periods of a common data clock signal (e.g., two times t0 of WCK 325) may correspond to one (1) period of a system clock signal (e.g., T0 of CK 310).

In some cases, a controller (e.g., an external memory controller 105, a device memory controller 155, a local memory controller 165 or 260) may activate (or cause to activate, such as by transmitting an indication to another controller or component) or deactivate (or cause to deactivate, such as by transmitting an indication to another controller or component) WCK 325 based on an operational mode of the memory die or the memory device. For example, WCK 325 may be deactivated (e.g., as depicted in the timing diagram 300 with a crosshatch pattern, which may indicate an unknown state) during a low-speed operational mode to reduce power consumption as illustrated in the timing diagram 300.

In some cases, a memory die (a memory die 160 of the memory device 110) may selectively generate an internal data clock signal (e.g., iWCK 330). In some cases, selective generation of the internal data clock signal may reduce power consumption. A period of the internal data clock signal (e.g., iWCK 330) may be independent of a system clock signal (e.g., CK 310) or a common data clock signal (e.g., WCK 325). In some cases, eight (8) periods of the internal data clock signal (e.g., iWCK 330) may be less than one (1) or two (2) periods of the system clock signal (e.g., CK 310). In some cases, the memory die (e.g., a local memory controller 165-a of a memory die 160-a, a local memory controller 260 of a memory die 200) may generate the internal data clock signal (e.g., iWCK 330) that operates faster than the common data clock signal (e.g., WCK 325) during a low-speed operational mode. For example, the memory die may activate iWCK 330 at time T0 and deactivate iWCK 330 at time T1 while producing data 345 (e.g., two sets of data including data 345-a and data 345-b) as described herein.

In some cases, a set of data (e.g., 256-bit data) may include sixteen (16) subsets of data (e.g., sixteen (16) bursts that each correspond to a subset of data) as shown in data 345 (e.g., a first subset 0 through a sixteenth subset F). The set of data may be generated during eight (8) periods (e.g., pulses) of WCK signal (e.g., WCK 325) or iWCK signal (e.g., iWCK 330). Each subset of data may be generated (e.g., strobed) at either a rising edge or a falling edge of the WCK signal or iWCK signal. A read data (DQ) strobe signal (e.g., RDQS 335) may coordinate a data signal (e.g., DQ 340) to appear at data input/output pins or channels (e.g., DQ pins, DQ channels 190). For example, the data 345-a including sixteen (16) bursts (e.g., each burst corresponding to subset of data 0 through F) as part of DQ 340, may illustrate such a set of data generated during eight (8) periods of iWCK 330. Accordingly, an access operation that generates a set of data including sixteen (16) bursts of data may be referred to as having a burst length of 16 (BL16). In some cases, a burst length of an access operation (e.g., a read operation) may be modified. For example, an access operation may have a burst length of 16 (e.g., BL16) or a burst length of 32 (e.g., BL32).

The command signal 320 (e.g., CMD 320) may illustrate various commands (e.g., a read command, a write command, a refresh command, a deselect (DES) command) for memory cells (e.g., memory cells 205 described with reference to FIG. 2) of a memory die (e.g., a memory die 160 or a memory die 200). For example, RD16 shown as part of the CMD 320 may include a read command with burst length of sixteen (BL16). Also, DES shown as part of the CMD 320 may include a DES command to deselect the memory cells. The chip select signal 315 (e.g., CS 315) may support activating or deactivating a memory die (e.g., a memory die 160 or a memory die 200) receiving the chip select signal 315. In some cases, a high state of CS 315 corresponds to an active status of a memory die receiving the CS 315. In some cases, a low state of CS 315 may correspond to a DES command—e.g., the memory cells are deselected. In some cases, the chip select signal 315 (e.g., CS 315) maintains a high state during at least some portion of a command signal 320 that is associated with a command such that the command (e.g., RD16-a, RD16-b) associated with the command signal 320 may be acknowledged by the memory die (e.g., a memory die 160 or a memory die 200).

During a first period T0 of a system clock signal (e.g., CK 310), a chip select signal (e.g., CS 315) may correspond to a high state to activate a memory die (e.g., a memory die 160, a memory die 200) and a command signal (e.g., an access command RD16-a of CMD 320) may request a set of data to be generated with a burst length of sixteen (16) from memory cells (e.g., memory cells 205) of the memory die.

In some cases, using a common data clock signal (e.g., WCK 325 having 2:1 ratio with respect to CK 310, meaning a frequency double that of CK 310), the access command RD16-a may take some number of periods (e.g., eight (8) periods) of WCK 325, which in turn corresponds to some other, possibly lesser number of periods (e.g., four (4) periods) of CK 310 (e.g., periods Ta0 through Ta3 in view of a read latency RL 350).

In some cases, a local memory controller (e.g., a local memory controller 260) of a memory die (e.g., a memory die 200) may, based on a period of the CK 310 in some cases, which may be indicated by one or more bits stored by a related mode register, identify that a memory device (e.g., a memory device 110 of a system 100) is in a low-speed operational mode. Thereafter, the local memory controller may disconnect (or deactivate) a common data clock that generates WCK 325 from a data clock tree (e.g., a WCK tree) of the memory die 200 (e.g., WCK 325 is deactivated as illustrated in the timing diagram 300). The local memory controller may activate an internal data clock (e.g., at time T0) to generate an internal data clock signal (e.g., iWCK 330) and route the internally generated iWCK 330 to the WCK tree of the memory die 200. In some cases, the number of periods (e.g., eight (8) periods) of iWCK 330 required for completion of the access command (e.g., RD16-a) may correspond to less than one (1) or two (2) periods of the system clock signal (e.g., CK 310) such that the memory die 200 may produce a set of data (e.g., data 345-a) corresponding to 16 bursts (e.g., BL16) during one (1) or two (2) periods of the system clock signal (e.g., CK 310) as illustrated in the timing diagram 300.

In some cases, a read latency (e.g. RL 350) may be related to a delay between a time when a read command (e.g., a read command RD16-a) is issued at the beginning of the first period T0 and a time when a first burst of data (e.g., a first burst 0 of data 345-a on DQ 340) appears at data input/output channel (e.g., DQ channels 190) in response to the read command.

In some cases, when the memory die operates using WCK 325, the read command RD16-a may be associated with at least four (4) periods of CK 310 (e.g., Ta0 through Ta3) that corresponds to a duration to generate the sixteen (16) bursts of data (e.g., the data 345-a) at data input/output pins or channels (e.g., DQ pins, DQ channels 190). As such, a next command (e.g., a read command RD16-b) may not be issued until a period Ta4, for example.

In some cases, when the memory die operates using iWCK 330 (e.g., during a low-speed operational mode), the read command RD16-a may be associated with a duration less than one (1) or two (2) periods of CK 310 (e.g., Ta0), where the duration corresponds to a time span to generate the sixteen (16) bursts of data (e.g., the data 345-a) at data input/output pins or channels. As such, a next command (e.g., a read command RD16-b) may be issued much earlier than the period Ta4 (e.g., during the period T1 as illustrated in the timing diagram 300) to generate a next set of data (e.g., data 345-b). In some cases, a local memory controller may deactivate the internal data clock (e.g., at time τ1) after producing requested sets of data (e.g., data 345-a and data 345-b) to reduce power consumption.

In this manner, the memory die (e.g., the memory die 160, the memory die 200) may generate a set of data having a burst length of sixteen (16) in a shorter duration and thus may increase a data bandwidth (e.g., I/O bandwidth) of the memory die during a low-speed operational mode. Also, the memory die may process an increased quantity of commands during a period of time and thus may increase a command bandwidth of the memory die 200 during the low-speed operational mode. Further, a circuit or components that generate or control WCK 325 (e.g., a common data clock) may be deactivated (e.g., shut-off) during the low-speed operational mode to reduce power consumption of a system (e.g., a system 100) that includes the memory device 110 (and the memory dice 160).

In some cases, a controller (e.g., a local memory controller 165) may identify a clock mode (e.g., a clock mode corresponding to a low-speed operational mode) for a system clock that generates a system clock signal (e.g., CK 310), where a first memory die (e.g., a memory die 160-a) and a second memory die (e.g., a memory die 160-b) may each be configured to receive the system clock signal (e.g., CK 310) and a common data clock signal (e.g., WCK 325). In some cases, the controller may generate an internal data clock signal (e.g., iWCK 330) for the first memory die and route the internal data clock signal (e.g., iWCK 330) to a data clock tree of the first memory die (e.g., a WCK tree) based identifying the clock mode.

In some cases, the controller may activate an internal data clock for the first memory die (e.g., the memory die 160-a) based on identifying the clock mode (e.g., the clock mode corresponding to the low-speed operational mode), where the internal data clock may be configured to generate the internal data clock signal (e.g., iWCK 330). In some cases, the controller may deactivate the internal data clock based on, after activating the internal data clock, identifying a second clock mode (e.g., a clock mode corresponding to a high-speed operational mode) for the system clock. In some cases, the controller may disconnect (or cause to disconnect by transmitting an indication to disconnect) a common data clock, where the common data clock may generate the common data clock signal (e.g., WCK 325), from the data clock tree of the first memory die based on identifying the clock mode (e.g., the clock mode corresponding to the low-speed operational mode).

In some cases, the controller may identify a second clock mode (e.g., a clock mode corresponding to a high-speed operational mode) for the system clock and route the common data clock signal (e.g., WCK 325) to the data clock tree of the first memory die (e.g., the memory die 160-a) based on identifying the second clock mode. In some cases, the controller may deactivate (or cause to deactivate by transmitting an indication to deactivate) a common data clock, where the common data clock generates the common data clock signal (e.g., WCK 325), based on identifying the clock mode (e.g., the clock mode corresponding to the low-speed operational mode). In some cases, the controller may deactivate (or cause to deactivate by transmitting an indication to deactivate) a common control signal for the first memory die (e.g., the memory die 160-a) and the second memory die (e.g., the memory die 160-b) based on identifying the clock mode (e.g., the clock mode corresponding to the low-speed operational mode).

In some cases, the controller may adjust a burst length of an access operation (e.g., RD16 of CMD 320) related to memory cells included in the first memory die based on identifying the clock mode (e.g., the clock mode corresponding to the low-speed operational mode). In some cases, the internal data clock signal (e.g., iWCK 330) may have a shorter period than the common data clock signal (e.g., WCK 325). In some cases, the internal data clock signal (e.g., iWCK 330) may have a shorter period than the system clock signal (e.g., CK 310).

In some cases, identifying the clock mode may include identifying the system clock signal (e.g., CK 310) as having a first speed (e.g., a speed corresponding to a low-speed operational mode), where the system clock signal (e.g., CK 310) may support at least the first speed and a second speed (e.g., a speed corresponding to a high-speed operational mode) that may be greater than the first speed. In some cases, the controller may perform an access operation (e.g., RD16 of CMD 320) for memory cells (e.g., memory cells 205) included in the first memory die, the access operation based on the internal data clock signal (e.g., iWCK 330), where the access operation may include a duration less than two periods of the system clock signal (e.g., CK 310). In some cases, identifying the clock mode may include determining that a mode register for the first memory die (e.g., the memory die 160-a) may indicate a speed of the system clock, and determining the indicated speed of the system clock based on the mode register (e.g., based on the value of one or more bits stored by the mode register).

Figure 4:
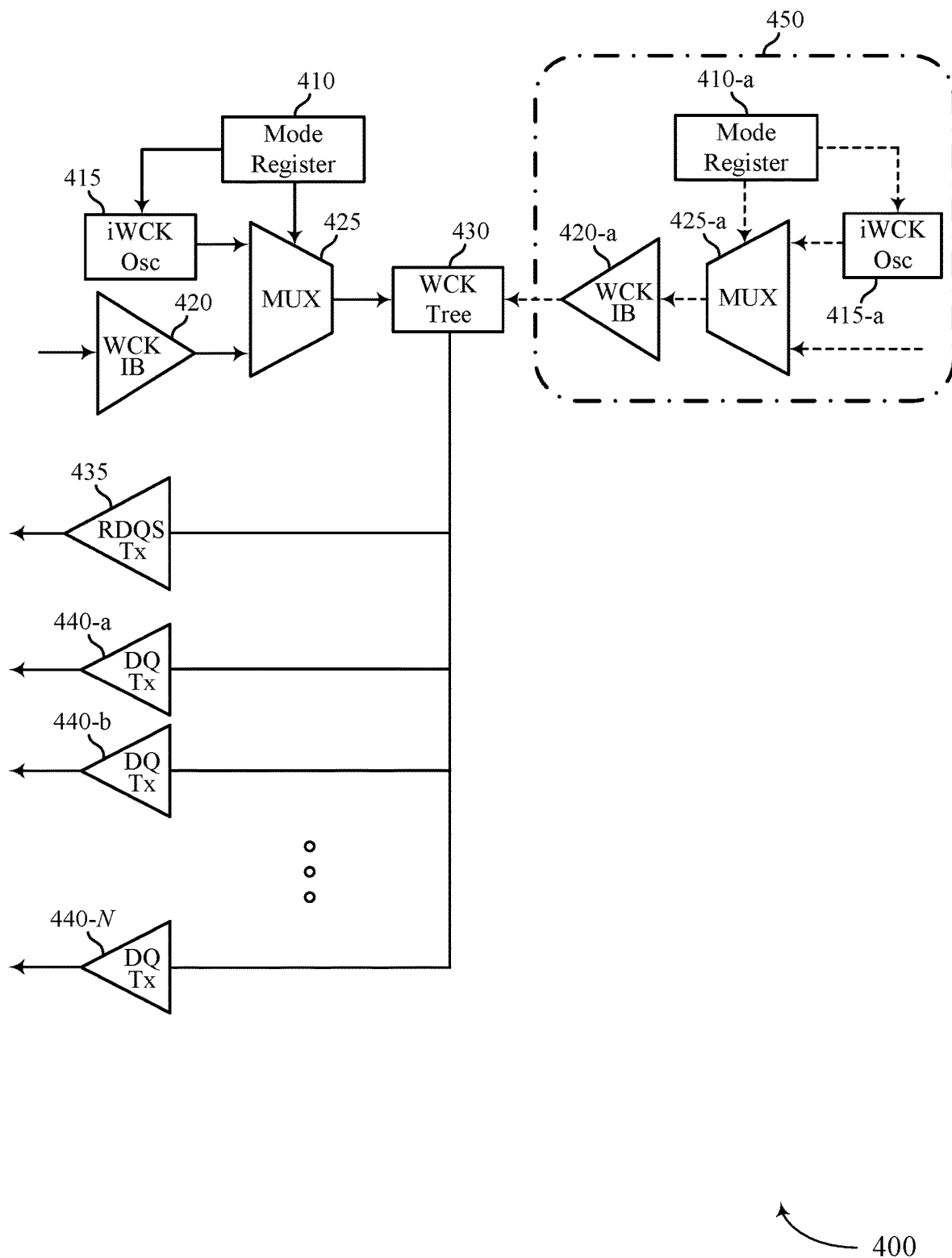
FIGS. 4 through 5 show block diagrams of devices that support a low-speed memory operation in accordance with aspects disclosed herein.

FIG. 4 shows a block diagram 400 of a device that supports a low-speed memory operation in accordance with aspects disclosed herein. The diagram 400 may be part of a memory die (e.g., a memory die 160, a memory die 200 described with reference to FIGS. 1 and 2) in a memory device (e.g., a memory device 110 described with reference to FIG. 1). The diagram 400 may include a mode register 410, an internal data clock 415, a common data clock input buffer (WCK IB) 420, a multiplexor 425, a data clock (WCK) tree 430, a read data strobe (RDQS) buffer 435, and a quantity of data (DQ) buffer 440. The block diagram 400 also illustrates a diagram 450, which may be an alternative arrangement of the above listed components, namely a mode register 410-a, an internal data clock 415-a, a common data clock input buffer (WCK IB) 420-a, and a multiplexor 425-a.

The mode register 410 may store indications of operational modes of the memory die (which may also be referred to as modes of operation of a memory die). In some cases, the memory die may support more than one operational modes. For example, the memory die may support a low-speed operational mode, a mid-speed operational mode, or a high-speed operational mode, or any combination thereof. In some cases, each operational mode may be associated with a clock mode for a system clock that may generate a system clock signal (e.g., CK 310 described with reference to FIG. 3). In some cases, the mode register 410 may store indications of a speed of the system clock (e.g., a first system clock speed, a second system clock speed). In some cases, the mode register 410 may be a mode identification component that may identify a mode of operation of the memory die. In other cases, the mode register 410 may facilitate a mode identification component (e.g., a component within a local memory controller of the memory die) to identify a mode of operation of the memory die.

In some cases, the mode register 410 may produce an output for the internal data clock 415. The output for the internal data clock 415 may activate or deactivate the internal data clock 415 based on a mode of operation stored in the mode register 410. In some cases, the mode register 410 may also produce an output for the multiplexor 425 based on the mode of operation stored in the mode register 410. The output for the multiplexor 425 may facilitate the multiplexor 425 to select between an internal data clock signal (e.g., iWCK 330) and a common data clock signal (e.g., WCK 325).

The internal data clock 415 may generate an internal data clock signal (e.g., iWCK 330) when activated (e.g., activated by the output of the mode register 410, in some cases). In some cases, the internal data clock 415 may be activated or deactivated based on the indication of an operational mode of the memory die. The internal data clock 415 may generate the internal data clock signal (e.g., iWCK 330) that may have a period less than a period of the common data clock signal (e.g., WCK 325) or a period of the system clock signal (e.g., CK 310). The internal data clock 415 may provide its output (e.g., iWCK 330) to the multiplexor 425. In some cases, the internal data clock 415 may include an oscillator. The oscillator may determine accuracy of a period of the internal data clock signal (e.g., iWCK 330). In some cases, a regulated power supply may provide a power to the oscillator such that the period of the internal data clock signal (e.g., iWCK 330) may have reduced variation or fluctuation, and thus be more precisely configured or determined, which may further support the more precise configuration of other components due to reduced design tolerances and like requirements with respect to internal data clock signal frequency/period fluctuations.

The common data clock input buffer (WCK IB) 420 may receive a common data clock signal (e.g., WCK 325) generated by a common data clock. The common data clock may be an external component (e.g., external to the memory die) such as a component included in or otherwise controlled by a host or a controller (e.g., an external memory controller 105, a device memory controller 155) of a system (e.g., a system 100). In some cases, the WCK IB 420 may receive and transfer (e.g., relay) the common data clock signal (e.g., WCK 325) to the multiplexor 425.

The multiplexor 425 may select between the internal data clock signal (e.g., iWCK 330) and the common data clock signal (e.g., WCK 325) based on the output generated by the mode register 410. For example, when the output of the mode register 410 indicates a low-speed operational mode, the multiplexor 425 may select the internal data clock signal (e.g., iWCK 330). Subsequently, in some cases, the common data clock that generates the common data clock signal (e.g., WCK 325) may be deactivated to reduce power consumption. On the other hand, when the output of the mode register 410 indicates a high-speed operational mode, the multiplexor 425 may select the common data clock signal (e.g., WCK 325). Further, the multiplexor 425 may transfer (e.g., relay) the selected clock signal (e.g., either iWCK 330 or WCK 325) to the data clock (WCK) tree 430.

The WCK tree 430 may provide a data clock signal (e.g., iWCK 330 or WCK 325) to coordinate generating a set of data (DQ) that includes a quantity of subsets of data (DQ). For example, generating a set of data including sixteen (16) subsets of data (e.g., data 345 described with reference to FIG. 3) in response to a read command with BL16 may require eight (8) periods (e.g., pulses), and thus 16 edges, of the data clock signal. When the WCK tree 430 provides the common data clock signal (e.g., WCK 325) to the RDQS buffer 435 and the DQ buffers 440, generating the set of data may require a duration equal to some number of periods (e.g., four (4) periods) of the system clock signal (e.g., CK 310) that corresponds to the eight (8) periods of WCK 325.

When the WCK tree 430 provides the internal data clock signal (e.g., iWCK 330) to the RDQS buffer 435 and the DQ buffers 440, generating the set of data may require a duration that is less than one (1) or two (2) periods of the system clock signal (e.g., CK 310), as the eight (8) periods of iWCK 330 may occur within fewer periods of the system clock signal (e.g., CK 310), as compared to eight (8) periods of common data clock signal (e.g., WCK 325). Though described in the context of a BL16 access operation and a double-data rate configuration, and thus eight (8) periods and sixteen (16) clock edges of the utilized data clock, it is to be understood that the teachings herein may be applied to access operations having any burst length and any relationship between burst length and the number clock edges of the utilized data clock (e.g., SDR, DDR).

Outputs of the RDQS buffer 435 and the DQ buffers 440 may be transmitted to a host or a controller (e.g., an external memory controller 105) of a system. The outputs of the DQ buffers 440 may be transmitted via DQ channels 190 as described with reference to FIG. 1. The output of the RDQS buffer 435 may be transmitted via other channels 196 as described with reference to FIG. 1.

The diagram 450 illustrates an alternative arrangement of the components. For example, the diagram 450 shows the WCK IB 420-*a* receiving an output from the multiplexor 425-*a* and transferring (e.g., relaying) the output to the WCK tree 430. In some cases, the WCK IB 420-*a* may enhance the stability of a data clock signal (e.g., iWCK 330, WCK 325) provided to the WCK tree 430.

In some cases, a memory device (e.g., a memory device 110) may include a first memory die (e.g., a memory die 160-*a*) configured to receive a common data clock signal (e.g., WCK 325) that may be common to the first memory die and a second memory die (e.g., a memory die 160-*b*), an internal data clock (e.g., an internal data clock 415) included in the first memory die and configured to generate an internal data clock signal (e.g., iWCK 330) for the first memory die, and a selection component (e.g., a multiplexor 425) configured to route the common data clock signal (e.g., WCK 325) or the internal data clock signal (e.g., iWCK 330) to a data clock tree (e.g., WCK tree 430) of the first memory die based on a mode of operation of the first memory die.

In some cases, the memory device may further include a mode identification component (e.g., a mode register 410) configured to identify the mode of operation of the first memory die and enable the internal data clock (e.g., iWCK 330) based on identifying the mode of operation as a first mode of operation (e.g., a low-speed operational mode). In some cases, the mode identification component may be configured to disable the internal data clock (e.g., the internal data clock 415) based on identifying the mode of operation as a second mode of operation (e.g., a fast-speed operational mode). In some cases, the selection component (e.g., the multiplexor 425) may be configured to route the internal data clock signal (e.g., iWCK 330) to the data clock tree (e.g., WCK tree 430) of the first memory die when the mode of operation corresponds to a first system clock speed (e.g., a system clock speed corresponding to a low-speed operational mode). Further, the selection component (e.g., the multiplexor 425) may be configured to route the common data clock signal (e.g., WCK 325) to the data clock tree (e.g., WCK tree 430) of the first memory die when the mode of operation corresponds to a second system clock speed (e.g., a system clock speed corresponding to a high-speed operational mode) that may be greater than the first system clock speed.

In some cases, the memory device may further include a common system clock that may be coupled with the first memory die and the second memory die, and a mode register (e.g., the mode register 410) configured to store an indication of a speed of the common system clock, where the mode of operation may correspond to the speed of the common system clock. In some cases, the internal data clock signal (e.g., iWCK 330) may have a shorter period than the common data clock signal (e.g., WCK 325). In some cases, the memory device may further include a controller (e.g., a device memory controller 155) that may be common to the first memory die and the second memory die, where the controller may be configured to disable the common data clock signal (e.g., WCK 325) based on the mode of operation. In some cases, the internal data clock (e.g., the internal data clock 415) may include an oscillator included within the first memory die. Also, the memory device may include a regulated power supply configured to power the oscillator.

In some cases, a memory device (e.g., a memory device 110) may include a first memory die configured to receive a system clock signal (e.g., CK 310) and a common data clock signal (e.g., WCK 325), a second memory die configured to receive the system clock signal (e.g., CK 310) and the common data clock signal (e.g., WCK 325), an internal data clock (e.g., an internal data clock 415) included in the first memory die and configured to generate an internal data clock signal (e.g., iWCK 330) for the first memory die, where the internal data clock signal (e.g., iWCK 330) has a first period and the common data clock signal (e.g., WCK 325) has a second period (e.g., t0 described with reference to FIG. 3) that may be longer than the first period, and a selection component (e.g., a multiplexor 425) included in the first memory die, the selection component configured to select the common data clock signal (e.g., WCK 325) or the internal data clock signal (e.g., iWCK 330) based on a speed of the system clock signal (e.g., CK 310).

In some cases, the selection component (e.g., a multiplexor 425) may be configured to select the internal data clock signal (e.g., iWCK 330) when the speed of the system clock signal (e.g., CK 310) may be at a minimum speed supported by the system clock signal (e.g., CK 310). Further, the selection component (e.g., a multiplexor 425) may be configured to select the common data clock signal (e.g., WCK 325) when the speed of the system clock signal (e.g., CK 310) may be at a maximum speed supported by the system clock signal (e.g., CK 310). In some cases, the memory device may further include a data clock tree (e.g., a data clock (WCK) tree 430) included in the first memory die, where the data clock tree may be configured to receive a data clock signal selected by the selection component (e.g., the multiplexor 425). In some cases, the memory device may further include an activation component that may be configured to activate the internal data clock (e.g., the internal data clock 415) based on identifying the speed of the system clock signal (e.g., CK 310) as a minimum speed supported by the system clock signal, and deactivate the internal data clock (e.g., the internal data clock 415) based on identifying the speed of the system clock signal (e.g., CK 310) as a maximum speed supported by the system clock signal (e.g., CK 310).

Figure 5:
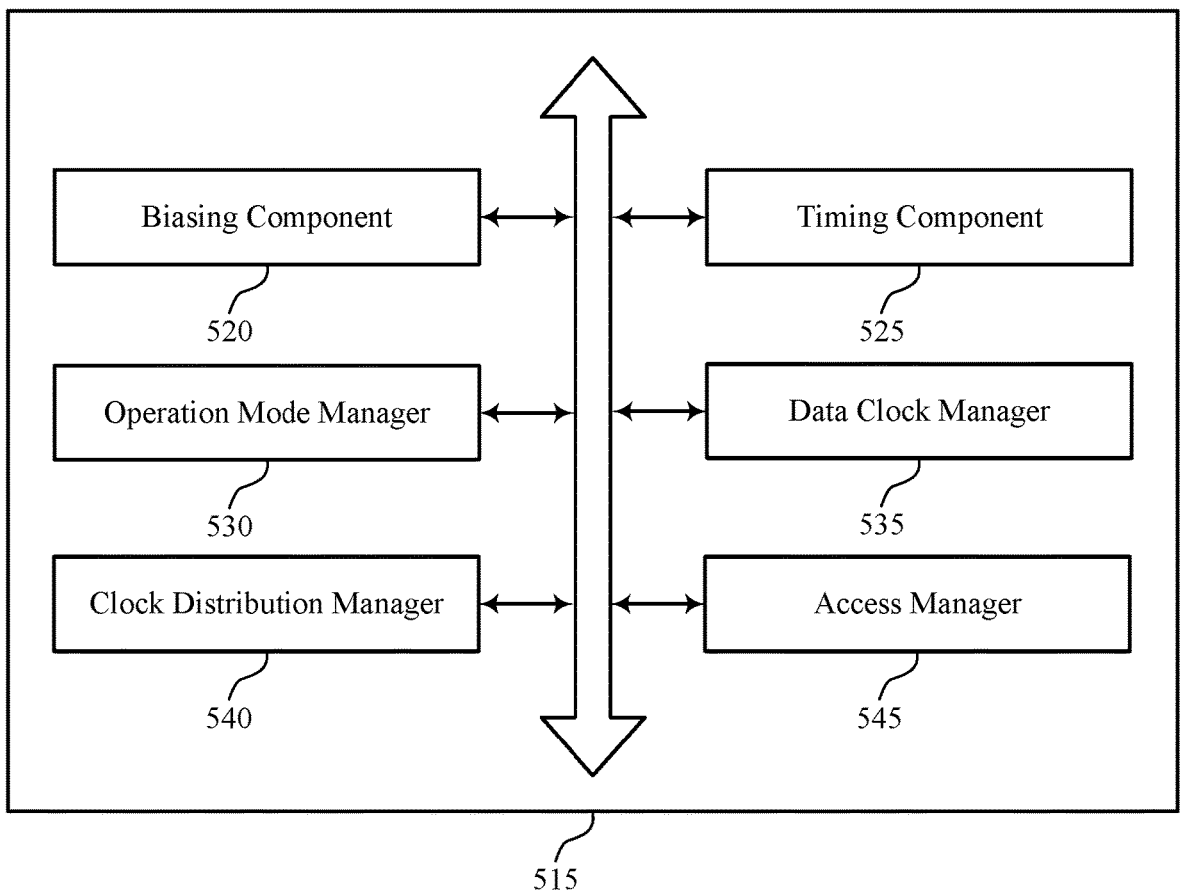

FIG. 5 shows a block diagram 500 of a controller 515 that supports a low-speed memory operation in accordance with aspects disclosed herein. The controller 515 may be an example of aspects of a local memory controller 165 or a local memory controller 260 described with reference to FIGS. 1 through 2. The controller 515 may include a biasing component 520, a timing component 525, an operation mode manager 530, a data clock manager 535, a clock distribution manager 540, and an access manager 545. Each of these modules may communicate, directly or indirectly, with one another (e.g., via one or more buses).

The operation mode manager 530 may identify a clock mode for a system clock that may generate a system clock signal, where a first memory die and a second memory die may each be configured to receive the system clock signal and a common data clock signal. In some cases, the operation mode manager 530 may identify a second clock mode for the system clock. In some cases, the operation mode manager 530 may adjust a burst length of an access operation related to memory cells included in the first memory die based on identifying the clock mode.

In some cases, identifying the clock mode may include identifying the system clock signal as having a first speed, where the system clock signal may support at least the first speed and a second speed that may be greater than the first speed. In some cases, identifying the clock mode may include identifying the system clock signal as having a first speed, where the system clock signal may support at least the first speed and a second speed that may be greater than the first speed. In some cases, identifying the clock mode may include determining that a mode register for the first memory die may indicate a speed of the system clock.

In some cases, the operation mode manager 530 may identify a system clock speed as below a threshold, the system clock speed being associated with a system clock signal that may be common to a first memory die and a second memory die. In some cases, the operation mode manager 530 may, after identifying the system clock speed as below the threshold, identify the system clock speed as above the threshold.

The data clock manager 535 may generate an internal data clock signal for the first memory die. In some cases, the data clock manager 535 may activate an internal data clock for the first memory die based on identifying the clock mode, where the internal data clock may be configured to generate the internal data clock signal. In some cases, the data clock manager 535 may deactivate the internal data clock based on, after activating the internal data clock, identifying a second clock mode for the system clock. In some cases, the data clock manager 535 may deactivate a common data clock, where the common data clock may generate the common data clock signal, based on identifying the clock mode.

In some cases, the data clock manager 535 may deactivate a common control signal for the first memory die and the second memory die based on identifying the clock mode. In some cases, generating the internal data clock signal may include generating the internal data clock signal having a shorter period than the common data clock signal. In some cases, generating the internal data clock signal may include generating the internal data clock signal having a shorter period than the system clock signal.

In some cases, the data clock manager 535 may activate the internal data clock based on identifying the system clock speed as below the threshold. In some cases, the data clock manager 535 may generate, by the internal data clock, an internal data clock signal having a first period that may be shorter than a second period of the common data clock signal. In some cases, the data clock manager 535 may deactivate the internal data clock based on identifying the system clock speed as above the threshold.

The clock distribution manager 540 may route the internal data clock signal to a data clock tree of the first memory die based on identifying the clock mode. In some cases, the clock distribution manager 540 may disconnect a common data clock, where the common data clock may generate the common data clock signal, from the data clock tree of the first memory die based on identifying the clock mode. In some cases, the clock distribution manager 540 may route the common data clock signal to the data clock tree of the first memory die based on identifying the second clock mode.

In some cases, the clock distribution manager 540 may disconnect a common data clock from a data clock tree of the first memory die based on identifying the system clock speed as below the threshold, the common data clock generating a common data clock signal that may be common to the first memory die and the second memory die. In some cases, the clock distribution manager 540 may connect an internal data clock within the first memory die to the data clock tree based on identifying the system clock speed as below the threshold. In some cases, the clock distribution manager 540 may connect the common data clock to the data clock tree of the first memory die based on identifying the system clock speed as above the threshold. In some cases, the clock distribution manager 540 may disconnect the internal data clock from the data clock tree based on identifying the system clock speed as above the threshold.

The access manager 545 may perform an access operation for memory cells included in the first memory die, the access operation based on the internal data clock signal, and the access operation having a duration less than two periods of the system clock signal. In some cases, the access manager 545 may perform an access operation, based on the internal data clock, on memory cells included in the first memory die, where the access operation may have a duration that may be less than two periods of the system clock signal. In some cases, the duration may be less than one period of the system clock signal.

Figure 6:
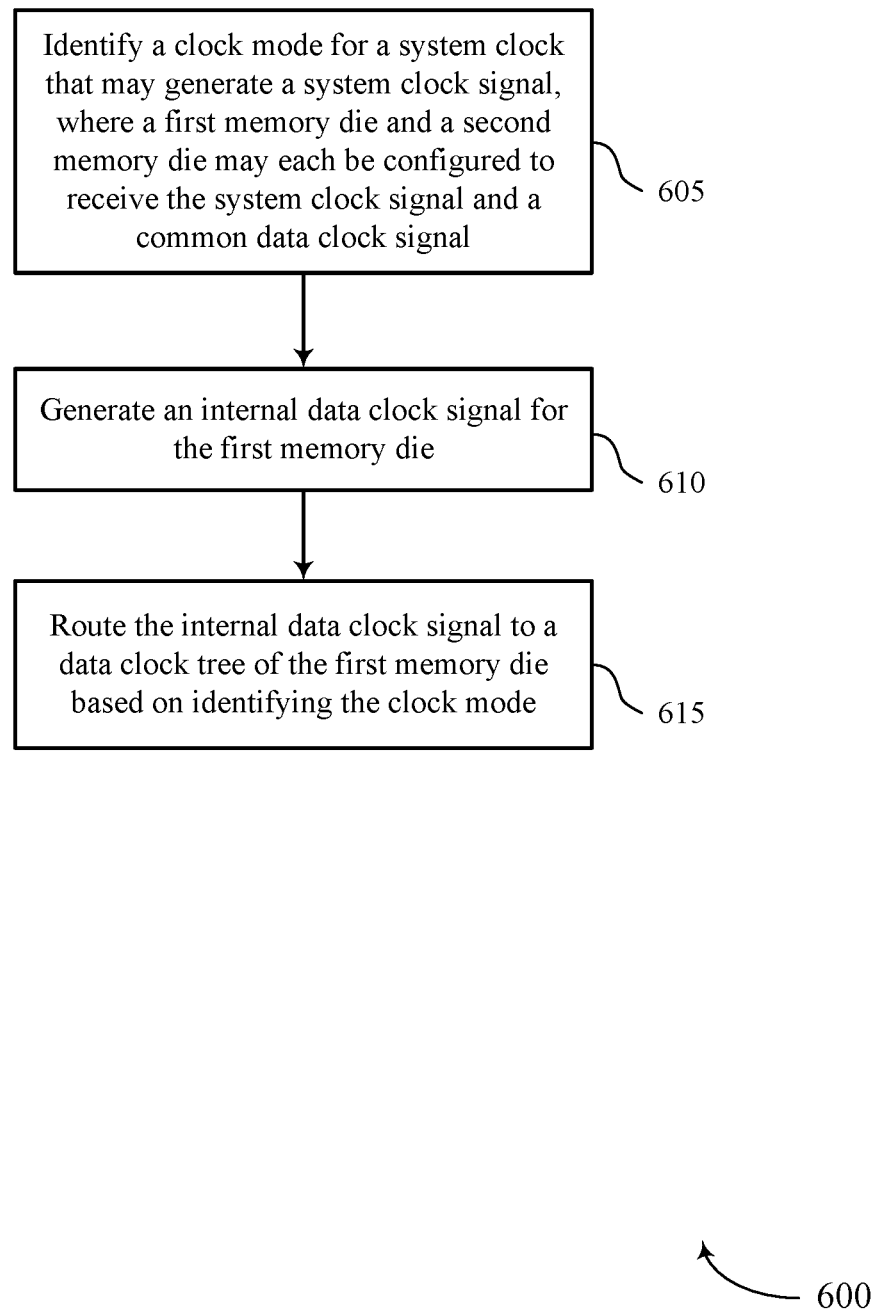
FIGS. 6 through 7 illustrate a method or methods supporting a low-speed memory operation in accordance with aspects disclosed herein.

FIG. 6 shows a flowchart illustrating a method 600 that supports a low-speed memory operation in accordance with aspects disclosed herein. The operations of method 600 may be implemented by a controller or its components as described with reference to FIGS. 1, 2, and 5. For example, the operations of method 600 may be performed by a local memory controller 165, a local memory controller 260, or a controller 515 described with reference to FIGS. 1, 2, and 5. In some examples, the controller 515 may execute a set of codes to control the functional elements of the device to perform the functions described below. Additionally or alternatively, the controller 515 may perform aspects of the functions described below using special-purpose hardware.

At 605 the controller 515 may identify a clock mode for a system clock that may generate a system clock signal, where a first memory die and a second memory die may each be configured to receive the system clock signal and a common data clock signal. The operations of 605 may be performed according to the methods described with reference to FIGS. 1-5. In certain examples, aspects of the operations of 605 may be performed by an operation mode manager as described with reference to FIG. 6.

At 610 the controller 515 may generate an internal data clock signal for the first memory die. The operations of 610 may be performed according to the methods described with reference to FIGS. 1-5. In certain examples, aspects of the operations of 610 may be performed by a data clock manager as described with reference to FIG. 5.

At 615 the controller 515 may route the internal data clock signal to a data clock tree of the first memory die based on identifying the clock mode. The operations of 615 may be performed according to the methods described with reference to FIGS. 1-5. In certain examples, aspects of the operations of 615 may be performed by a clock distribution manager as described with reference to FIG. 5.

In some examples, an apparatus as described herein may perform a method or methods, such as the method 600. The apparatus may include means for identifying a clock mode for a system clock that may generate a system clock signal, where a first memory die and a second memory die may each be configured to receive the system clock signal and a common data clock signal, means for generating an internal data clock signal for the first memory die, and means for routing the internal data clock signal to a data clock tree of the first memory die based on identifying the clock mode.

Another apparatus for performing a method or methods, such as the method 600, is described. The apparatus may include a memory array and a local memory controller in electronic communication with the memory array, where the local memory controller may be operable to identity a clock mode for a system clock that may generate a system clock signal, where a first memory die and a second memory die may each be configured to receive the system clock signal and a common data clock signal, generate an internal data clock signal for the first memory die, and route the internal data clock signal to a data clock tree of the first memory die based on identifying the clock mode.

Some examples of the method 600 and apparatuses described herein may further include processes, features, means, or instructions for activating an internal data clock for the first memory die based on identifying the clock mode, where the internal data clock may be configured to generate the internal data clock signal. Some examples of the method 600 and apparatuses described herein may further include processes, features, means, or instructions for deactivating the internal data clock based on, after activating the internal data clock, identifying a second clock mode for the system clock. Some examples of the method 600 and apparatuses described herein may further include processes, features, means, or instructions for disconnecting a common data clock, where the common data clock may generate the common data clock signal, from the data clock tree of the first memory die based on identifying the clock mode.

Some examples of the method 600 and apparatuses described herein may further include processes, features, means, or instructions for identifying a second clock mode for the system clock. Some examples of the method 600 and apparatuses described herein may further include processes, features, means, or instructions for routing the common data clock signal to the data clock tree of the first memory die based on identifying the second clock mode. Some examples of the method 600 and apparatuses described herein may further include processes, features, means, or instructions for deactivating a common data clock, where the common data clock may generate the common data clock signal, based on identifying the clock mode.

Some examples of the method 600 and apparatuses described herein may further include processes, features, means, or instructions for deactivating a common control signal for the first memory die and the second memory die based on identifying the clock mode. Some examples of the method 600 and apparatuses described herein may further include processes, features, means, or instructions for adjusting a burst length of an access operation related to memory cells included in the first memory die based on identifying the clock mode. In some examples of the method 600 and apparatuses described herein, generating the internal data clock signal may include generating the internal data clock signal having a shorter period than the common data clock signal.

In some examples of the method 600 and apparatuses described herein, generating the internal data clock signal may include generating the internal data clock signal having a shorter period than the system clock signal. In some examples of the method 600 and apparatuses described herein, identifying the clock mode may include identifying the system clock signal as having a first speed, where the system clock signal may support at least the first speed and a second speed that may be greater than the first speed. Some examples of the method 600 and apparatuses described herein may further include processes, features, means, or instructions for performing an access operation for memory cells included in the first memory die, the access operation based on the internal data clock signal, and the access operation having a duration less than two periods of the system clock signal. In some examples of the method 600 and apparatuses described herein, identifying the clock mode may include determining that a mode register for the first memory die indicates a speed (e.g., a minimum speed or a speed below a threshold) of the system clock.

Figure 7:
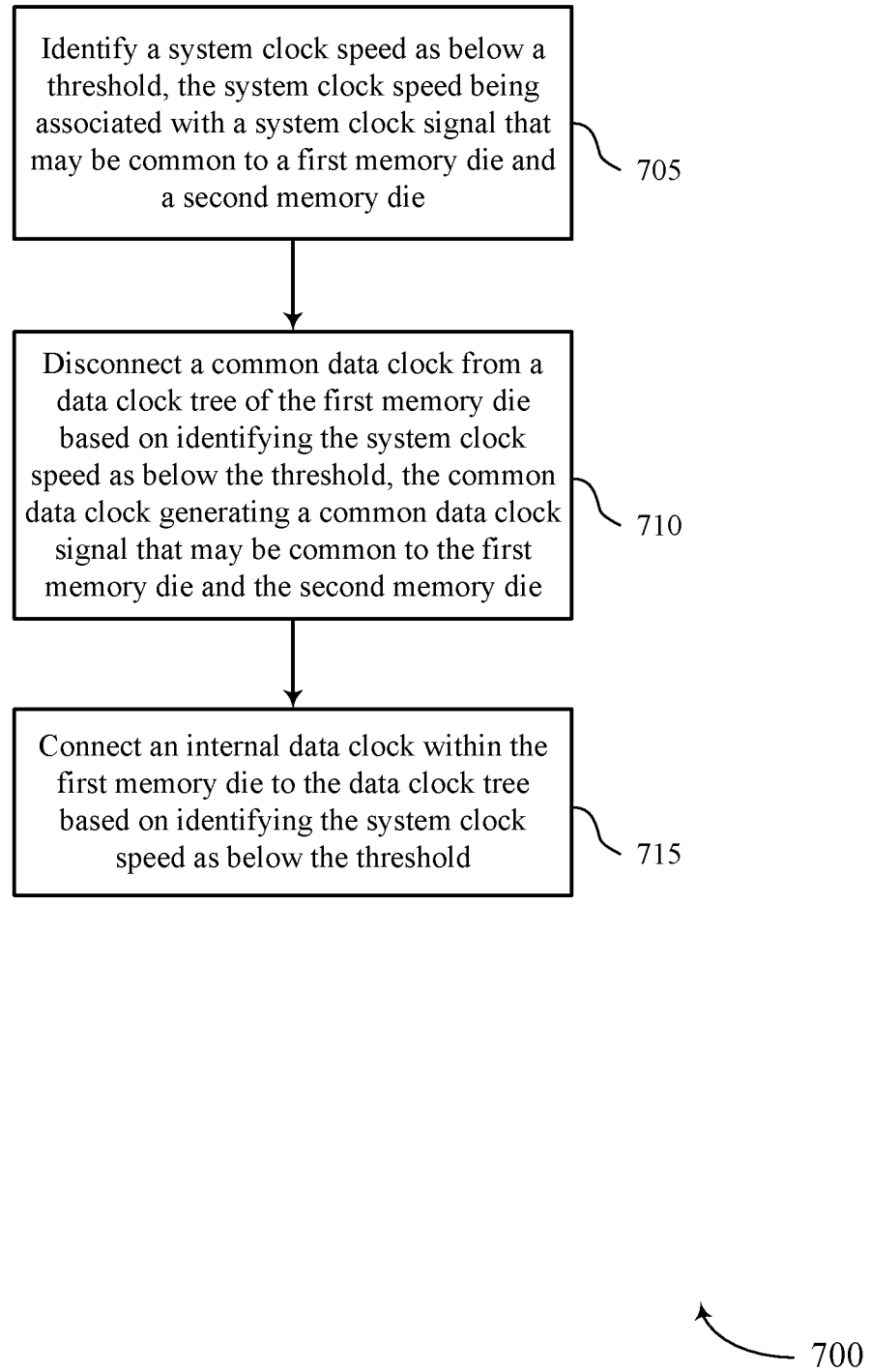

FIG. 7 shows a flowchart illustrating a method 700 that supports a low-speed memory operation in accordance with aspects disclosed herein. The operations of method 700 may be implemented by a controller or its components as described with reference to FIGS. 1, 2, and 5. For example, the operations of method 700 may be performed by a local memory controller 165, a local memory controller 260, or a controller 515 described with reference to FIGS. 1, 2, and 5. In some examples, the controller 515 may execute a set of codes to control the functional elements of the device to perform the functions described below. Additionally or alternatively, the controller 515 may perform aspects of the functions described below using special-purpose hardware.

At 705 the controller 515 may identify a system clock speed as below a threshold, the system clock speed being associated with a system clock signal that may be common to a first memory die and a second memory die. The operations of 705 may be performed according to the methods described with reference to FIGS. 1-5. In certain examples, aspects of the operations of 705 may be performed by an operation mode manager as described with reference to FIG. 5.

At 710 the controller 515 may disconnect a common data clock from a data clock tree of the first memory die based on identifying the system clock speed as below the threshold, the common data clock generating a common data clock signal that may be common to the first memory die and the second memory die. The operations of 710 may be performed according to the methods described with reference to FIGS. 1-5. In certain examples, aspects of the operations of 710 may be performed by a clock distribution manager as described with reference to FIG. 5.

At 715 the controller 515 may connect an internal data clock within the first memory die to the data clock tree based on identifying the system clock speed as below the threshold. The operations of 715 may be performed according to the methods described with reference to FIGS. 1-5. In certain examples, aspects of the operations of 715 may be performed by a clock distribution manager as described with reference to FIG. 5.

In some examples, an apparatus as described herein may perform a method or methods, such as the method 700. The apparatus may include means for identifying a system clock speed as below a threshold, the system clock speed being associated with a system clock signal that may be common to a first memory die and a second memory die, means for disconnecting a common data clock from a data clock tree of the first memory die based on identifying the system clock speed as below the threshold, the common data clock generating a common data clock signal that may be common to the first memory die and the second memory die, and means for connecting an internal data clock within the first memory die to the data clock tree based on identifying the system clock speed as below the threshold.

Another apparatus for performing a method or methods, such as the method 700, is described. The apparatus may include a memory array and a controller in electronic communication with the memory medium, where the controller may be operable to identify a system clock speed as below a threshold, the system clock speed being associated with a system clock signal that may be common to a first memory die and a second memory die, disconnect a common data clock from a data clock tree of the first memory die based on identifying the system clock speed as below the threshold, the common data clock generating a common data clock signal that may be common to the first memory die and the second memory die, and connect an internal data clock within the first memory die to the data clock tree based on identifying the system clock speed as below the threshold.

Some examples of the method 700 and apparatuses described herein may further include processes, features, means, or instructions for activating the internal data clock based on identifying the system clock speed as below the threshold. Some examples of the method 700 and apparatuses described herein may further include processes, features, means, or instructions for performing an access operation, based on the internal data clock, on memory cells included in the first memory die, where the access operation has a duration that may be less than two periods of the system clock signal. In some examples of the method 700 and apparatuses described herein, the duration may be less than one period of the system clock signal.

Some examples of the method 700 and apparatuses described herein may further include processes, features, means, or instructions for generating, by the internal data clock, an internal data clock signal having a first period that may be shorter than a second period of the common data clock signal. Some examples of the method 700 and apparatuses described herein may further include processes, features, means, or instructions for, after identifying the system clock speed as below the threshold, identifying the system clock speed as above the threshold. Some examples of the method 700 and apparatuses described herein may further include processes, features, means, or instructions for connecting the common data clock to the data clock tree of the first memory die based on identifying the system clock speed as above the threshold. Some examples of the method 700 and apparatuses described herein may further include processes, features, means, or instructions for disconnecting the internal data clock from the data clock tree based on identifying the system clock speed as above the threshold. Some examples of the method 700 and apparatuses described herein may further include processes, features, means, or instructions for deactivating the internal data clock based on identifying the system clock speed as above the threshold.

In some examples, an apparatus may perform aspects of the functions described herein using special-purpose hardware. The apparatus may include a first memory die configured to receive a common data clock signal that may be common to the first memory die and a second memory die, an internal data clock included in the first memory die and configured to generate an internal data clock signal for the first memory die, and a selection component configured to route the common data clock signal or the internal data clock signal to a data clock tree of the first memory die based on a mode of operation of the first memory die.

In some cases, the apparatus may include a mode identification component configured to identify the mode of operation of the first memory die and enable the internal data clock based on identifying the mode of operation as a first mode of operation. In some cases, the mode identification component may be configured to disable the internal data clock based on identifying the mode of operation as a second mode of operation. In some cases, the selection component may be configured to route the internal data clock signal to the data clock tree of the first memory die when the mode of operation corresponds to a first system clock speed, and the selection component may be configured to route the common data clock signal to the data clock tree of the first memory die when the mode of operation may correspond to a second system clock speed that may be greater than the first system clock speed.

In some cases, the apparatus may include a common system clock that may be coupled with the first memory die and the second memory die, and a mode register configured to store an indication of a speed of the common system clock, wherein the mode of operation may correspond to the speed of the common system clock. In some cases, the internal data clock signal may have a shorter period than the common data clock signal. In some cases, the apparatus may include a controller that may be common to the first memory die and the second memory die, wherein the controller may be configured to disable the common data clock signal based on the mode of operation. In some cases, the internal data clock may include an oscillator included within the first memory die and a regulated power supply configured to power the oscillator.

In some examples, an apparatus may perform aspects of the functions described herein using special-purpose hardware. The apparatus may include a first memory die configured to receive a system clock signal and a common data clock signal, a second memory die configured to receive the system clock signal and the common data clock signal, an internal data clock included in the first memory die and configured to generate an internal data clock signal for the first memory die, wherein the internal data clock signal may have a first period and the common data clock signal may have a second period that is longer than the first period, and a selection component included in the first memory die, the selection component configured to select the common data clock signal or the internal data clock signal based on a speed of the system clock signal.

In some cases, the selection component may be configured to select the internal data clock signal when the speed of the system clock signal may be at a minimum speed supported by the system clock signal. In some cases, the selection component may be configured to select the common data clock signal when the speed of the system clock signal may be at a maximum speed supported by the system clock signal. In some cases, the apparatus may include a data clock tree included in the first memory die, wherein the data clock tree may be configured to receive a data clock signal selected by the selection component. In some cases, the apparatus may include an activation component configured to activate the internal data clock based on identifying the speed of the system clock signal as a minimum speed supported by the system clock signal and deactivate the internal data clock based on identifying the speed of the system clock signal as a maximum speed supported by the system clock signal.

In some examples, an apparatus may perform aspects of the functions described herein using special-purpose hardware. The apparatus may include a first memory die configured to receive a system clock signal and a common data clock signal, a second memory die configured to receive the system clock signal and the common data clock signal, and a controller configured to set a speed of the system clock signal to a first speed, wherein the system clock signal may support the first speed and a second speed greater than the first speed and disable the common data clock signal based on setting the speed of the system clock signal to the first speed.

In some cases, the controller may be further configured to set a first mode register included in the first memory die to indicate that the speed of the system clock signal may be set to the first speed and set a second mode register included in the second memory die to indicate that the speed of the system clock signal may be set to the second speed. In some cases, the controller may be further configured to set a burst length of an access operation for memory cells included in the first memory die based on setting the speed of the system clock signal to the first speed. In some cases, setting the burst length of the access operation may include setting a first mode register included in the first memory die to indicate the burst length of the access operation.

It should be noted that the methods described herein describe possible implementations, and that the operations and the steps may be rearranged or otherwise modified and that other implementations are possible. Further, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components.

Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The devices discussed herein, including memory dice 160, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the herein description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope disclosed herein. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can include RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
identifying a clock mode for a system clock that generates a system clock signal, wherein a first memory die and a second memory die are each configured to receive the system clock signal and a common data clock signal;
generating an internal data clock signal for the first memory die; and
routing the internal data clock signal to a data clock tree of the first memory die based at least in part on identifying the clock mode.

2. The method of claim 1, further comprising:
activating an internal data clock for the first memory die based at least in part on identifying the clock mode, wherein the internal data clock is configured to generate the internal data clock signal.

3. The method of claim 2, further comprising:
deactivating the internal data clock based at least in part on, after activating the internal data clock, identifying a second clock mode for the system clock.

4. The method of claim 1, further comprising:
disconnecting a common data clock, wherein the common data clock generates the common data clock signal, from the data clock tree of the first memory die based at least in part on identifying the clock mode.

5. The method of claim 1, further comprising:
identifying a second clock mode for the system clock; and
routing the common data clock signal to the data clock tree of the first memory die based at least in part on identifying the second clock mode.

6. The method of claim 1, further comprising:
deactivating a common data clock, wherein the common data clock generates the common data clock signal, based at least in part on identifying the clock mode.

7. The method of claim 1, further comprising:
deactivating a common control signal for the first memory die and the second memory die based at least in part on identifying the clock mode.

8. The method of claim 1, further comprising:
adjusting a burst length of an access operation related to memory cells included in the first memory die based at least in part on identifying the clock mode.

9. The method of claim 1, wherein generating the internal data clock signal comprises:
generating the internal data clock signal having a shorter period than the common data clock signal.

10. The method of claim 1, wherein generating the internal data clock signal comprises:
generating the internal data clock signal having a shorter period than the system clock signal.

11. The method of claim 10, wherein identifying the clock mode comprises:
identifying the system clock signal as having a first speed, wherein the system clock signal supports at least the first speed and a second speed that is greater than the first speed.

12. The method of claim 10, further comprising:
performing an access operation for memory cells included in the first memory die, the access operation based at least in part on the internal data clock signal, and the access operation having a duration less than two periods of the system clock signal.

13. The method of claim 1, wherein identifying the clock mode comprises:
determining that a mode register for the first memory die indicates a speed of the system clock.

14. A method, comprising:
identifying a system clock speed as below a threshold, the system clock speed being associated with a system clock signal that is common to a first memory die and a second memory die;
disconnecting a common data clock from a data clock tree of the first memory die based at least in part on identifying the system clock speed as below the threshold, the common data clock generating a common data clock signal that is common to the first memory die and the second memory die; and
connecting an internal data clock within the first memory die to the data clock tree based at least in part on identifying the system clock speed as below the threshold.

15. The method of claim 14, further comprising:
activating the internal data clock based at least in part on identifying the system clock speed as below the threshold.

16. The method of claim 14, further comprising:
performing an access operation, based at least in part on the internal data clock, on memory cells included in the first memory die, wherein the access operation has a duration that is less than two periods of the system clock signal.

17. The method of claim 16, wherein the duration is less than one period of the system clock signal.

18. The method of claim 14, further comprising:
generating, by the internal data clock, an internal data clock signal having a first period that is shorter than a second period of the common data clock signal.

19. The method of claim 14, further comprising:
after identifying the system clock speed as below the threshold, identifying the system clock speed as above the threshold;
connecting the common data clock to the data clock tree of the first memory die based at least in part on identifying the system clock speed as above the threshold;

disconnecting the internal data clock from the data clock tree based at least in part on identifying the system clock speed as above the threshold; and deactivating the internal data clock based at least in part on identifying the system clock speed as above the threshold.

20. An apparatus, comprising:

a first memory die configured to receive a common data clock signal that is common to the first memory die and a second memory die;

an internal data clock included in the first memory die and configured to generate an internal data clock signal for the first memory die; and a selection component configured to route the common data clock signal or the internal data clock signal to a data clock tree of the first memory die based at least in part on a mode of operation of the first memory die.

21. The apparatus of claim 20, further comprising:

a mode identification component configured to identify the mode of operation of the first memory die and enable the internal data clock based at least in part on identifying the mode of operation as a first mode of operation.

22. The apparatus of claim 21, wherein the mode identification component is configured to disable the internal data clock based at least in part on identifying the mode of operation as a second mode of operation.

23. The apparatus of claim 20, wherein:

the selection component is configured to route the internal data clock signal to the data clock tree of the first memory die when the mode of operation corresponds to a first system clock speed; and the selection component is configured to route the common data clock signal to the data clock tree of the first memory die when the mode of operation corresponds to a second system clock speed that is greater than the first system clock speed.

24. The apparatus of claim 20, further comprising:

a common system clock that is coupled with the first memory die and the second memory die; and a mode register configured to store an indication of a speed of the common system clock, wherein the mode of operation corresponds to the speed of the common system clock.

25. The apparatus of claim 20, wherein the internal data clock signal has a shorter period than the common data clock signal.

26. The apparatus of claim 20, further comprising:

a controller that is common to the first memory die and the second memory die, wherein the controller is configured to disable the common data clock signal based at least in part on the mode of operation.

27. The apparatus of claim 20, wherein the internal data clock comprises an oscillator included within the first memory die, the apparatus further comprising:

a regulated power supply configured to power the oscillator.

28. An apparatus, comprising:

a first memory die configured to receive a system clock signal and a common data clock signal;

a second memory die configured to receive the system clock signal and the common data clock signal;

an internal data clock included in the first memory die and configured to generate an internal data clock signal for the first memory die, wherein the internal data clock signal has a first period and the common data clock signal has a second period that is longer than the first period; and a selection component included in the first memory die, the selection component configured to select the common data clock signal or the internal data clock signal based at least in part on a speed of the system clock signal.

29. The apparatus of claim 28, wherein:

the selection component is configured to select the internal data clock signal when the speed of the system clock signal is at a minimum speed supported by the system clock signal; and the selection component is configured to select the common data clock signal when the speed of the system clock signal is at a maximum speed supported by the system clock signal.

30. The apparatus of claim 28, further comprising:

a data clock tree included in the first memory die, wherein the data clock tree is configured to receive a data clock signal selected by the selection component.

31. The apparatus of claim 28, further comprising:

an activation component configured to:

activate the internal data clock based at least in part on identifying the speed of the system clock signal as a minimum speed supported by the system clock signal; and deactivate the internal data clock based at least in part on identifying the speed of the system clock signal as a maximum speed supported by the system clock signal.

32. An apparatus, comprising:

a first memory die configured to receive a system clock signal and a common data clock signal;

a second memory die configured to receive the system clock signal and the common data clock signal; and a controller configured to:

set a speed of the system clock signal to a first speed, wherein the system clock signal supports the first speed and a second speed greater than the first speed; and disable the common data clock signal based at least in part on setting the speed of the system clock signal to the first speed.

33. The apparatus of claim 32, wherein the controller is further configured to:

set a first mode register included in the first memory die to indicate that the speed of the system clock signal is set to the first speed; and set a second mode register included in the second memory die to indicate that the speed of the system clock signal is set to the second speed.

34. The apparatus of claim 32, wherein the controller is further configured to:

set a burst length of an access operation for memory cells included in the first memory die based at least in part on setting the speed of the system clock signal to the first speed.

35. The apparatus of claim 34, wherein setting the burst length of the access operation comprises:

setting a first mode register included in the first memory die to indicate the burst length of the access operation.

* * * * *